(12) United States Patent
Jansson

(10) Patent No.: US 11,300,439 B2
(45) Date of Patent: Apr. 12, 2022

(54) SENSOR ASSEMBLY FOR MEASURING THE LEVEL OF A LIQUID

(71) Applicant: TE Connectivity Norge AS, Blomsterdalen (NO)

(72) Inventor: Niklas Jansson, Paradis (NO)

(73) Assignee: TE CONNECTIVITY NORGE AS, Blomsterdalen (NO)

( * ) Notice: Subject to any disclaimer, the term of this patent is extended or adjusted under 35 U.S.C. 154(b) by 0 days.

(21) Appl. No.: 16/903,905

(22) Filed: Jun. 17, 2020

(65) Prior Publication Data

US 2020/0400484 A1 Dec. 24, 2020

(30) Foreign Application Priority Data

Jun. 18, 2019 (EP) ..................................... 19180960

(51) Int. Cl.
*G01F 23/70* (2006.01)
*H01L 27/06* (2006.01)

(52) U.S. Cl.
CPC .......... *G01F 23/703* (2013.01); *H01L 27/067* (2013.01)

(58) Field of Classification Search
CPC .............................. G01F 23/703; H01L 27/067
USPC ............... 73/313, 292, 314, 1.31, 1.32, 1.73
See application file for complete search history.

(56) References Cited

U.S. PATENT DOCUMENTS

| 3,678,750 | A | * | 7/1972 | DiNoia | ................... G01F 23/72 |
| | | | | | 73/313 |
| 3,939,470 | A | * | 2/1976 | Arai | ....................... F01M 11/12 |
| | | | | | 340/450 |
| 4,135,186 | A | * | 1/1979 | Minorikawa | ......... G01F 23/247 |
| | | | | | 340/450.3 |
| 7,714,586 | B2 | | 5/2010 | Bolz | |
| 2012/0239302 | A1 | * | 9/2012 | Amir | ................... G01F 25/0061 |
| | | | | | 702/11 |

FOREIGN PATENT DOCUMENTS

| CN | 201444065 U | | 4/2010 |
| GB | 1288530 | * | 9/1972 |
| JP | 3-137523 | * | 6/1991 |
| JP | H04218723 A | | 8/1992 |

OTHER PUBLICATIONS

Extended European Search Report, European Application No. 19180960. 7-1001, European Filing Date, Nov. 29, 2019.

* cited by examiner

*Primary Examiner* — Robert R Raevis

(57) ABSTRACT

A sensor assembly for measuring a level of a liquid includes a measuring section through which a measuring current runs during operation of the sensor assembly and a temperature compensation section. The temperature compensation section compensates a temperature dependent variation of the measuring current within a predetermined operational temperature range.

23 Claims, 4 Drawing Sheets

SENSOR ASSEMBLY FOR MEASURING THE LEVEL OF A LIQUID

CROSS-REFERENCE TO RELATED APPLICATION

This application claims the benefit of the filing date under 35 U.S.C. § 119(a)-(d) of European Patent Application No. 19180960, filed on Jun. 18, 2019.

FIELD OF THE INVENTION

The present invention relates to a sensor assembly and, more particularly, to a sensor assembly for measuring the level of a liquid.

BACKGROUND

A sensor assembly for measuring the level of a liquid usually includes a measuring section through which a measuring current runs during operation of the sensor assembly. Known such sensor assemblies, however, can only be used in a limited range of temperatures.

SUMMARY

A sensor assembly for measuring a level of a liquid includes a measuring section through which a measuring current runs during operation of the sensor assembly and a temperature compensation section. The temperature compensation section compensates a temperature dependent variation of the measuring current within a predetermined operational temperature range.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
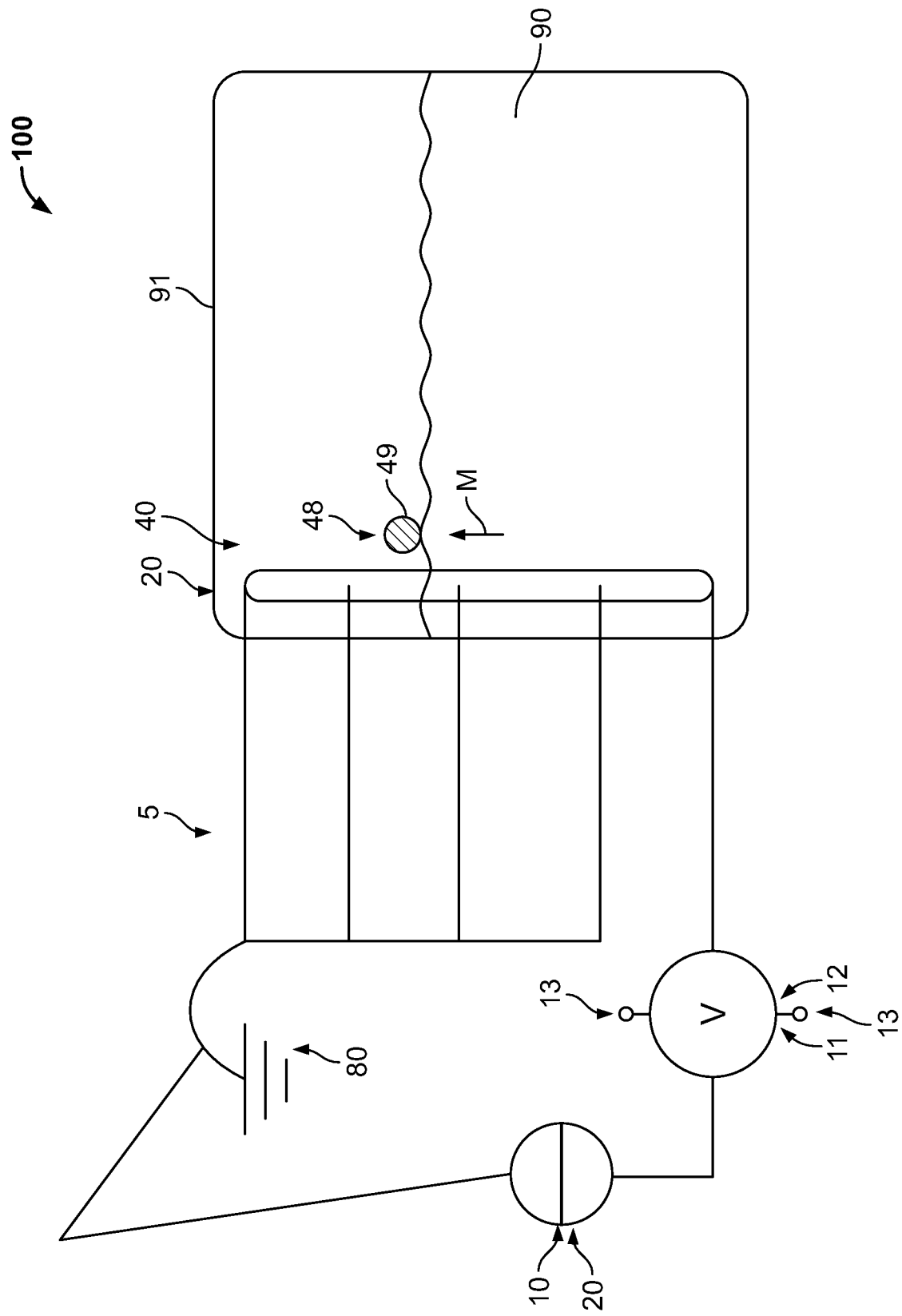
FIG. 1 is a schematic diagram of a sensor assembly according to an embodiment.

The invention will now be described in greater detail and in an exemplary manner using embodiments with reference to the drawings, wherein like reference numerals refer to like elements. The described embodiments are only possible configurations, and the individual features as described herein can be provided independently of one another or can be omitted.

A sensor assembly 100 according to an embodiment is shown in FIG. 1. The sensor assembly 100 is used for measuring the level of a liquid 90 that is, for example, retained in a tank 91. The liquid 90 can, for example, be Diesel Exhaust Fluid (DEF) that is used for the treatment of exhaust gases in automobiles.

Figure 2:
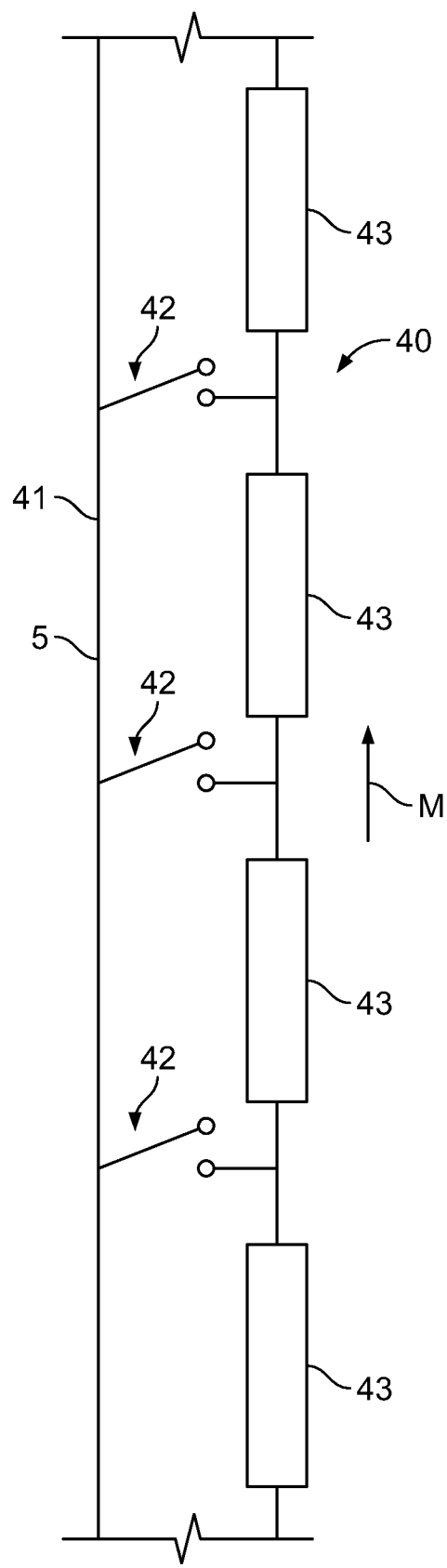
FIG. 2 is a schematic diagram of a measuring section of the sensor assembly.
Figure 3:
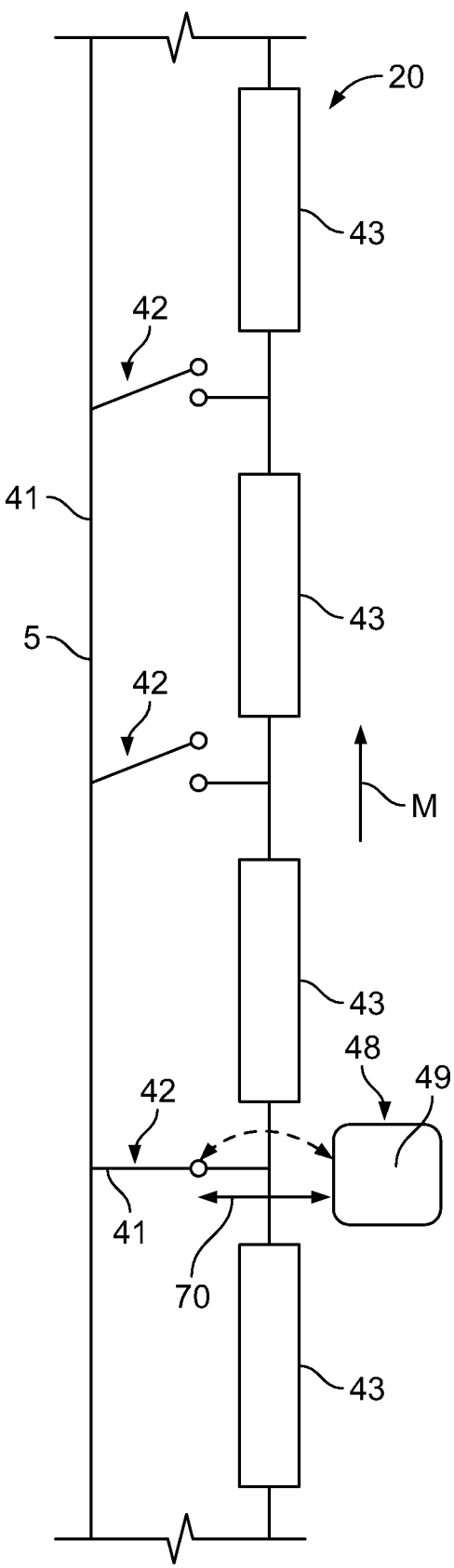
FIG. 3 is a schematic diagram of the measuring section of FIG. 2 with a float.

As shown in FIGS. 1-3, a float 49 floats on the liquid 90 and triggers one or more switches 42 at a time when it is within a predetermined distance 70 from the switch 42. The switches 42 can, for example, be reed switches that react to magnetic forces generated by a magnet of the float 49. The float 49 can move along a measuring direction M.

The sensor assembly 100, as shown in FIG. 1, includes a measuring section 40 for measuring the level of the liquid 90 along the measuring direction M.

The sensor assembly 100, as shown in FIG. 1, includes a current source 10 that provides a constant current.

The sensor assembly 100, as shown in FIG. 1, includes a voltage meter 11 that measures the voltage in an electrical circuit 5 of the sensor assembly 100. The voltage is indicative of the level of the liquid 90 in the tank 91. The voltage meter 11 can thus serve as an output section 12 where output values representing different levels of the liquid 90 can be output. The voltage meter 11 can include a plurality of outputs 13 at which the voltage or signals representing the voltage can be output and be taken up by an external element, for example, for further processing.

As shown in FIGS. 2 and 3, the measuring section 40 includes a plurality of resistors 43 that are located along a measuring direction M and connected serially to each other. Each of the resistors 43 is associated with one of the switches 42 and is disposed between a pair of neighboring switches 42. FIG. 2 shows the measuring section 40 without the float 49; consequently, all of the switches 42 are in an open state. In FIG. 3, the float 49 which includes a triggering section 48 with a magnet is located close to one of the switches 42 and in particular within the predetermined distance 70 so that the switch 42 is closed. In various embodiments, the predetermined distance 70 is below 20 cm, below 10 cm, or below 5 cm to allow a precise measurement. The predetermined distance 70 can be such that the float 49 has to be in contact with an element comprising the switch 42 to trigger the switch 42. Consequently, the electric circuit is closed via this switch 42 and the voltage and the electric circuit 5 changes relative to the situation shown in FIG. 2.

Depending on the position of the float 49 along the measuring direction M, a varying number of resistors 43 are part of the electric circuit 5 and, consequently, the voltage changes for each of the positions. This allows deducing the position of the float 49 and thus of the level of the liquid 90 based on the voltage in the electric circuit 5. At one side, the switches 42 are connected to a common voltage level, in particular to a ground 80. Different levels of the liquid 90 are thus associated with different switches 42. Each switch 42 is associated with a different resistance value of the electric circuit 5. Every resistance value is associated with a specific number of resistors 43, that could have the same value.

The switches 42, as shown in FIGS. 2 and 3, can be spaced from each other at equal distances. In other embodiments, the distances can vary and in particular be smaller in areas where a higher resolution is desired. Each switch 42 is associated with one resistor 43. Further, each of the resistors 43 has the same resistance value. This makes production easy as only one type of resistor 43 has to be kept in stock and the risk that the production has to be paused is reduced.

The sensor assembly 100, as shown in FIGS. 1 and 3, includes at least one temperature compensation section 20 for compensating temperature dependent variations of a measuring current 41 within the predetermined operational temperature range. The sensor assembly 100 can, for example, be used in automobiles or in machinery that is exposed to low environmental temperatures in the winter and high environmental temperatures in the summer. The sensor assembly 100 can be used in a wide operational temperature range due to the temperature compensation section 20. In particular, the operational range can, for example, go from −40° C. to +105° C. In the operational temperature range, the measuring current 41 is basically constant, meaning that the variation is less than 10%, less than 5%, or less than 2% in various embodiments.

Output values measured at the output section 12 can also be independent of the temperature within the operational temperature range. However, the values of course vary depending on the level of the liquid 90 in the tank 91. The output values can be voltages, allowing easy further processing, or digital values having predetermined voltage levels.

The temperature compensation section 20 can be part of the current source 10 so that the current that is generated therein is independent of the temperature. In another embodiment, the temperature compensation section 20 can be connected to the current source 10 directly, that is, without any intermediate elements between the temperature compensating section 20 and the current source 10. In another embodiment, the temperature compensation section 20 can be in the measuring section 40.

Figure 4:
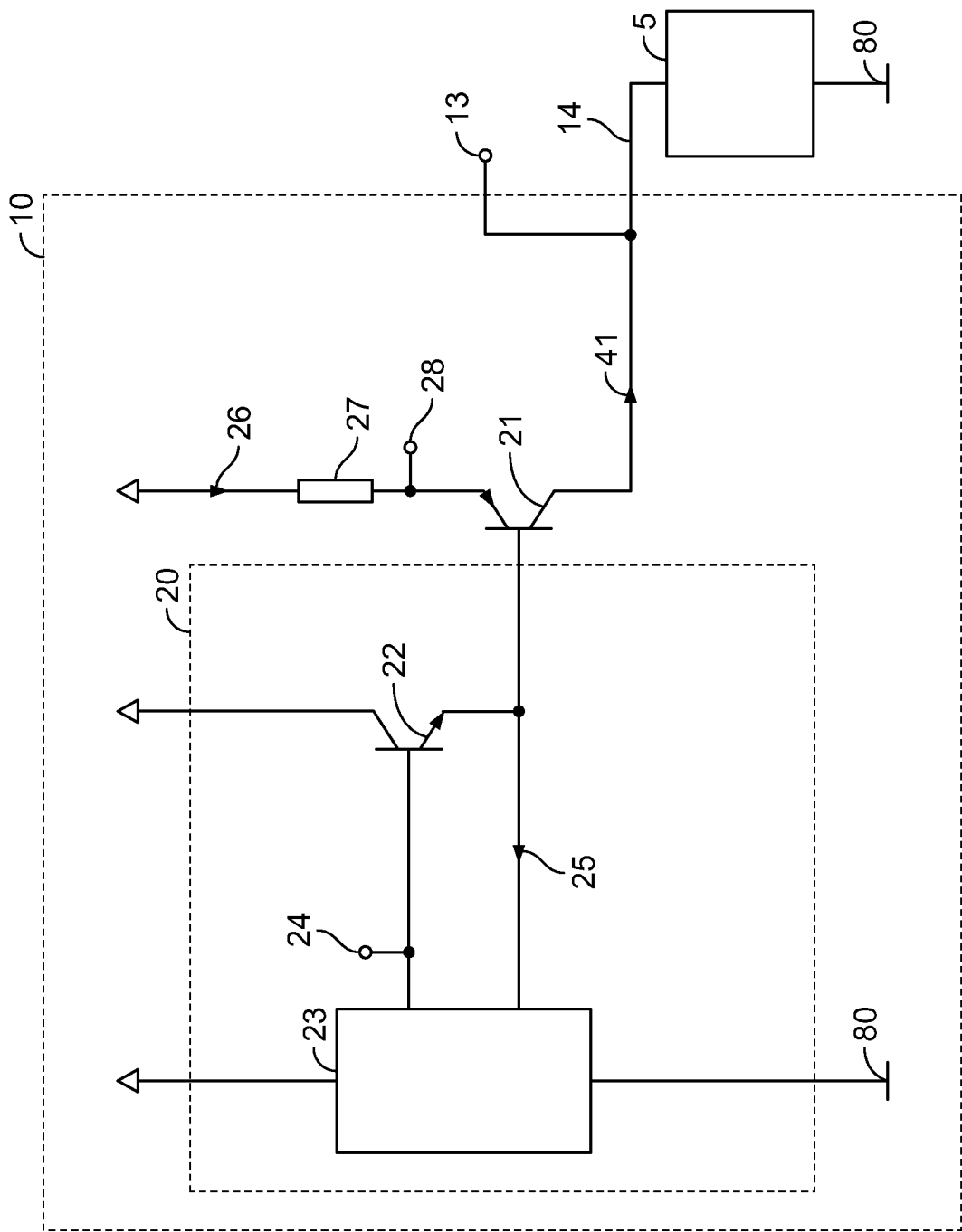
FIG. 4 is a circuit diagram of a current source of the sensor assembly.

FIG. 4 shows an embodiment in which the temperature compensating section 20 is located in the current source 10. The temperature compensation section 20 can, in particular, include a first transistor 21 and a second transistor 22, which are only shown schematically. Both transistors 21 and 22 are located in such a way that they are exposed to the same temperature to minimize the voltage differences in their temperature dependent base-emitter junctions. In an embodiment, the first transistor 21 is a PNP-transistor and the second transistor 22 is an NPN-transistor.

The current source 10, as shown in FIG. 4, regulates a shunt resistor current 26 based on a reference voltage 24 provided by the temperature compensation section 20. The goal is to regulate a shunt resistor voltage 28 of a shunt resistor 27 to the same voltage as the reference voltage 24. The shunt resistor current 26 is the sum of a biasing current 25 and the measuring current 41. However, the biasing current 25 can be fixed and also very small in comparison to the measuring current 41, so the measurement error can be neglected. The biasing current 25 is fed into a reference and biasing network 23.

The temperature dependence of the two transistors 21, 22 can cancel each other out so that the overall temperature performance or overall temperature coefficient is 0 or almost 0, at least over the predetermined operational range. The output current measured at a contact 14 is then independent of the temperature.

FIG. 4 shows the use of two transistors 21, 22. However, more than two transistors 21, 22 can be used. For example, the temperature compensation section 20 can comprise three, four, five or more transistors 21, 22. The group of transistors 21, 22 can be adapted to each other to result in a temperature compensated overall coefficient. At least one temperature compensation section 20 can also be part of the measuring section 40. The temperature compensation section 20 can, in particular, comprise elements that regulate the current or the voltage. Temperature compensation section 20 can also take account of temperature dependencies in other elements, in particular the resistors 42. However, the resistance of such resistors 42 are usually less dependent on the temperature.

Figure 5:
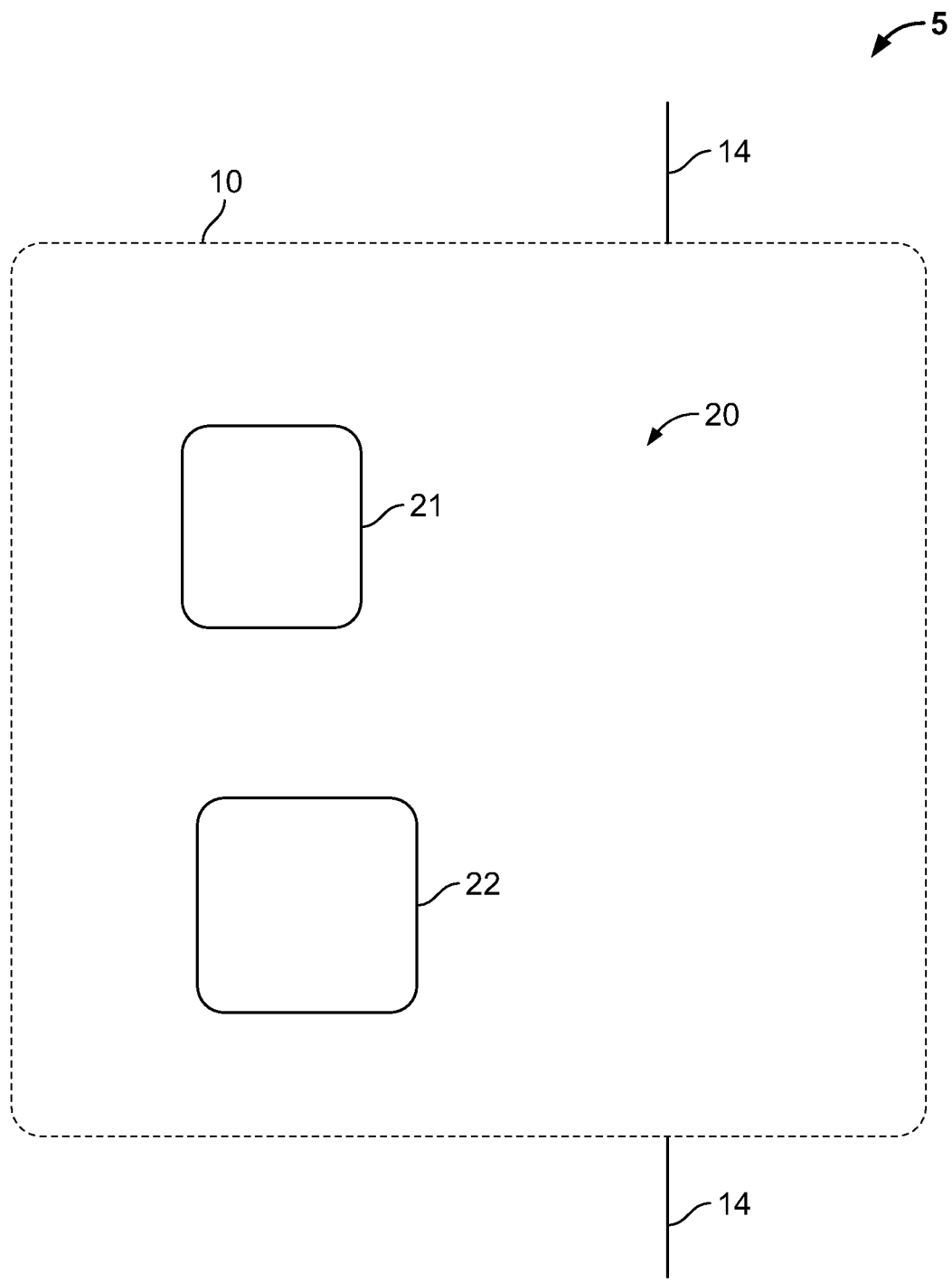
FIG. 5 is a block diagram of a current source according to another embodiment.

In an embodiment shown in FIG. 5, the temperature compensating section 20 is again located in the current source 10. The temperature compensation section 20 can, in particular, include a first transistor 21 and a second transistor 22, which are only shown schematically. One of the transistors 21, 22 has a positive temperature coefficient and the other transistor 22, 21 has a negative temperature coefficient. Positive temperature coefficients and negative temperature coefficients mean that the output of the transistor 21, 22 increases or decreases, respectively, when the temperature increases. The temperature coefficients of the two transistors 21, 22 are inverse and cancel each other out so that the overall temperature performance or overall temperature coefficient is 0 or almost 0, at least over the predetermined operational range. The output current measured at the contacts 14 is then independent of the temperature.

What is claimed is:

1. A sensor assembly for measuring a level of a liquid, comprising:
    a measuring section through which a measuring current runs during operation of the sensor assembly; and
    a temperature compensation section compensating a temperature dependent variation of the measuring current within a predetermined operational temperature range, the temperature compensation section includes a first transistor and a second transistor.

2. The sensor assembly of claim 1, further comprising a current source, the temperature compensation section is part of the current source.

3. The sensor assembly of claim 1, wherein a constant current is generated in the measuring section.

4. The sensor assembly of claim 1, wherein the measuring section includes a plurality of switches and a plurality of resistors, each of the switches is associated with one of the resistors.

5. The sensor assembly of claim 4, wherein the first transistor and the second transistor compensate a temperature coefficient of the resistors.

6. The sensor assembly of claim 4, wherein the resistors are arranged serially behind each other in the measuring section.

7. The sensor assembly of claim 6, wherein each of the resistors is disposed between a pair of neighboring switches.

8. The sensor assembly of claim 4, wherein the resistors each have a same resistance value.

9. The sensor assembly of claim 4, further comprising a float movable relative to the measuring section along a measuring direction.

10. The sensor assembly of claim 9, wherein the float floats on the liquid and includes a triggering section.

11. The sensor assembly of claim 10, wherein the triggering section operates one of the switches if the one of the switches is within a predetermined distance of the float.

12. The sensor assembly of claim 1, wherein a temperature dependence of the first transistor and the second transistor compensate each other over the predetermined operational temperature range.

13. The sensor assembly of claim 1, wherein the first transistor has a positive temperature coefficient and the second transistor has a negative temperature coefficient, the positive temperature coefficient and the negative temperature coefficient compensate each other over the predetermined operational temperature range.

14. The sensor assembly of claim 13, wherein the positive temperature coefficient and the negative temperature coefficient are inverse to each other over the predetermined operational temperature range.

15. The sensor assembly of claim 1, wherein one of the first transistor and the second transistor is a PNP-transistor and the other of the first transistor and the second transistor is a NPN-transistor.

16. The sensor assembly of claim 1, wherein the temperature compensation section includes a group of three or more transistors adapted to each other to result in a temperature compensated overall coefficient.

17. A sensor assembly for measuring a level of a liquid, comprising:
- a measuring section through which a measuring current runs during operation of the sensor assembly, the measuring section includes a plurality of switches and a plurality of resistors, each of the switches is associated with one of the resistors; and
- a temperature compensation section compensating a temperature dependent variation of the measuring current within a predetermined operational temperature range.

18. The sensor assembly of claim 17, wherein the resistors are arranged serially behind each other in the measuring section.

19. The sensor assembly of claim 18, wherein each of the resistors is disposed between a pair of neighboring switches.

20. The sensor assembly of claim 17, wherein the resistors each have a same resistance value.

21. The sensor assembly of claim 17, further comprising a float movable relative to the measuring section along a measuring direction.

22. The sensor assembly of claim 21, wherein the float floats on the liquid and includes a triggering section.

23. The sensor assembly of claim 22, wherein the triggering section operates one of the switches if the one of the switches is within a predetermined distance of the float.

\* \* \* \* \*